United States Patent
Eneman et al.

(10) Patent No.: US 9,368,498 B2
(45) Date of Patent: Jun. 14, 2016

(54) FINFET DEVICE WITH DUAL-STRAINED CHANNELS AND METHOD FOR MANUFACTURING THEREOF

(71) Applicant: IMEC VZW, Leuven (BE)

(72) Inventors: Geert Eneman, Balen (BE); Benjamin Vincent, San Francisco, CA (US); Voon Yew Thean, Brussels (BE)

(73) Assignee: IMEC, Leuven (BE)

(*) Notice: Subject to any disclaimer, the term of this patent is extended or adjusted under 35 U.S.C. 154(b) by 0 days.

(21) Appl. No.: 14/878,012

(22) Filed: Oct. 8, 2015

(65) Prior Publication Data

US 2016/0027777 A1      Jan. 28, 2016

Related U.S. Application Data

(62) Division of application No. 14/086,486, filed on Nov. 21, 2013, now Pat. No. 9,171,904.

(60) Provisional application No. 61/733,641, filed on Dec. 5, 2012.

(51) Int. Cl.
*H01L 27/088* (2006.01)
*H01L 29/06* (2006.01)
(Continued)

(52) U.S. Cl.
CPC .... *H01L 27/0886* (2013.01); *H01L 21/823821* (2013.01); *H01L 29/0649* (2013.01); *H01L 29/1054* (2013.01); *H01L 29/161* (2013.01); *H01L 29/165* (2013.01); *H01L 29/1608* (2013.01); *H01L 29/7842* (2013.01); *H01L 29/7849* (2013.01)

(58) Field of Classification Search
CPC ............. H01L 21/823821; H01L 21/845; H01L 29/1054; H01L 29/161; H01L 29/66795; H01L 29/7849; H01L 29/785
See application file for complete search history.

(56) References Cited

U.S. PATENT DOCUMENTS

| | | | |
|---|---|---|---|
| 2004/0227154 A1* | 11/2004 | Chu | H01L 29/1025 257/194 |
| 2004/0262692 A1* | 12/2004 | Hareland | H01L 29/1054 257/369 |

(Continued)

OTHER PUBLICATIONS

Dereste Dos Santos, Sara et al., "Impact of Selective Epitaxial Growth and Uniaxial/Biaxial Strain on DIBL Effect Using Triple Gate FinFETS", Journal Integrated Circuits and Systems, vol. 5, No. 2, 2010, pp. 154-159.

(Continued)

*Primary Examiner* — Raj R Gupta
(74) *Attorney, Agent, or Firm* — McDonnell Boehnen Hulbert & Berghoff LLP

(57) ABSTRACT

A FinFET device and a method for manufacturing a FinFET device is provided. An example device may comprise a substrate including at least two fin structures. Each of the at least two fin structures may be in contact with a source and drain region and each of the at least two fin structures may include a strain relaxed buffer (SRB) overlying and in contact with the substrate and an upper layer overlying and in contact with the SRB. The composition of the upper layer and the SRB may be selected such that the upper layer of a first fin structure is subjected to a first mobility enhancing strain in the as-grown state, the first mobility enhancing strain being applied in a longitudinal direction from the source region to the drain region and where at least an upper part of the upper layer of a second fin structure is strain-relaxed.

12 Claims, 13 Drawing Sheets

(51) Int. Cl.
*H01L 29/10* (2006.01)
*H01L 29/16* (2006.01)
*H01L 29/161* (2006.01)
*H01L 29/165* (2006.01)
*H01L 29/78* (2006.01)
*H01L 21/8238* (2006.01)

(56) References Cited

U.S. PATENT DOCUMENTS

| | | |
|---|---|---|
| 2007/0120154 A1 | 5/2007 | Zhu et al. |
| 2007/0249130 A1 | 10/2007 | Anderson et al. |
| 2008/0237572 A1* | 10/2008 | Chui ............... H01L 29/155 257/14 |
| 2009/0114955 A1 | 5/2009 | Stapelmann et al. |
| 2011/0027978 A1* | 2/2011 | Hargrove ......... H01L 21/26586 438/585 |
| 2011/0169085 A1 | 7/2011 | Xu et al. |

OTHER PUBLICATIONS

Itokawa, Hiroshi et al., "Modifications of Growth of Strained Silicon and Dopant Activation in Silicon by Cryogenic Ion Implantation and Recrystallization Annealing", 2012 12th International Workshop on Junction Technology (IWJT), May 14-15, 2012, pp. 210-215.

Kuhn, Kelin J. et al., "Technology Options for 22nm and Beyond", 2010 International Workshop on Junction Technology (IWJT), May 10-11, 2011, pp. 1-6.

* cited by examiner

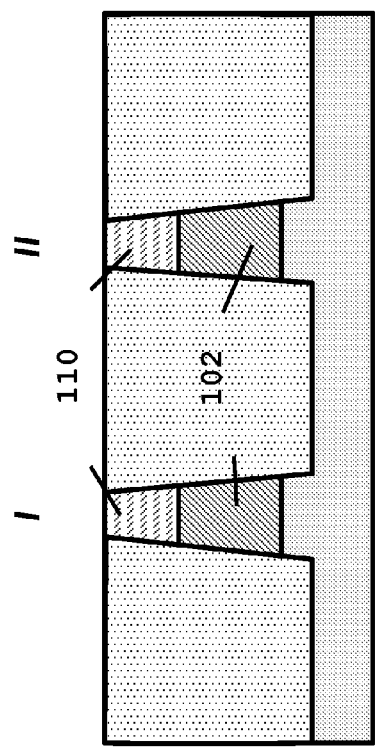
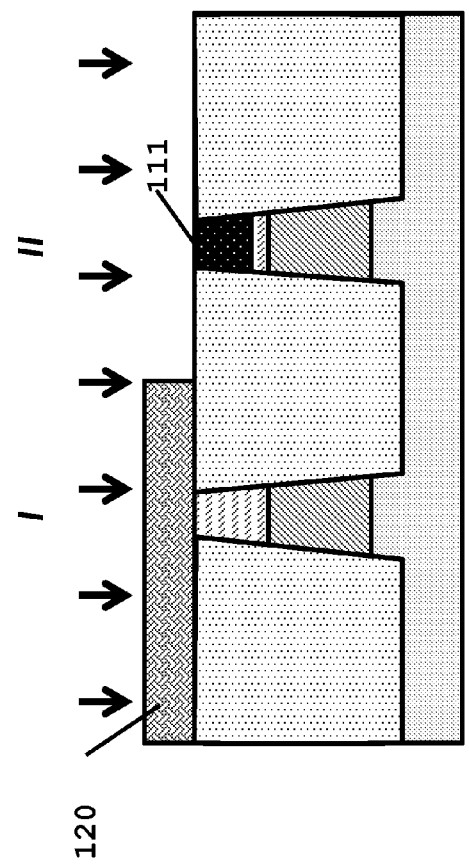

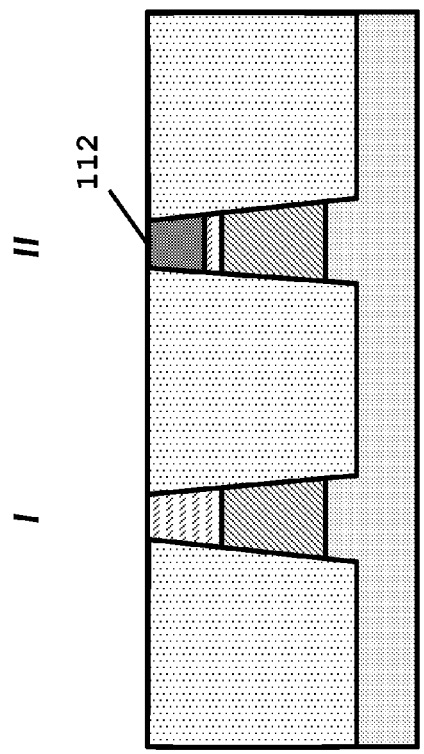
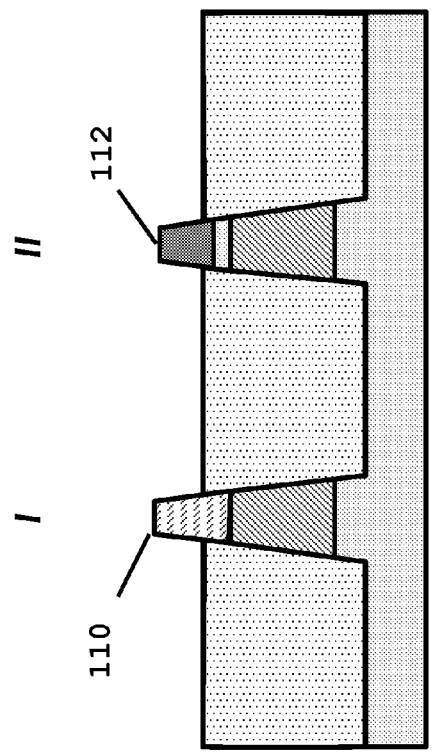
Figure 1E
Figure 1F

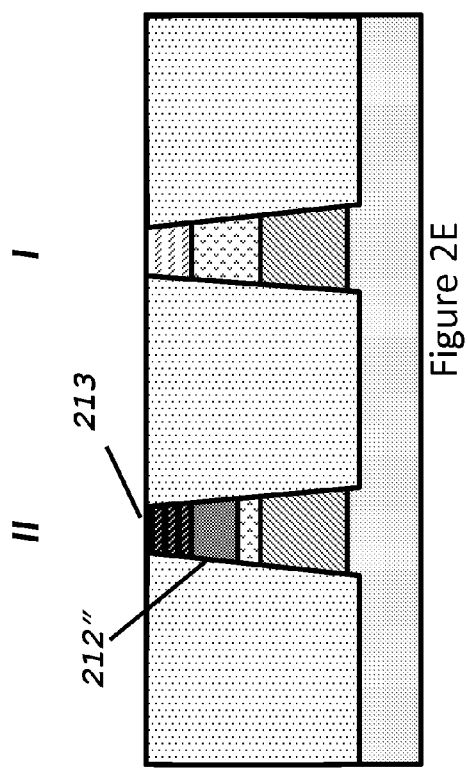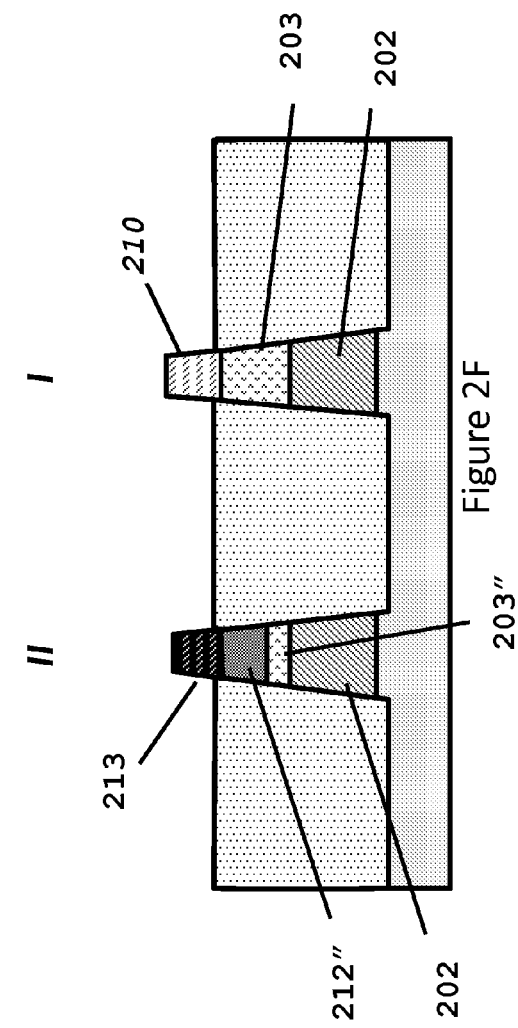

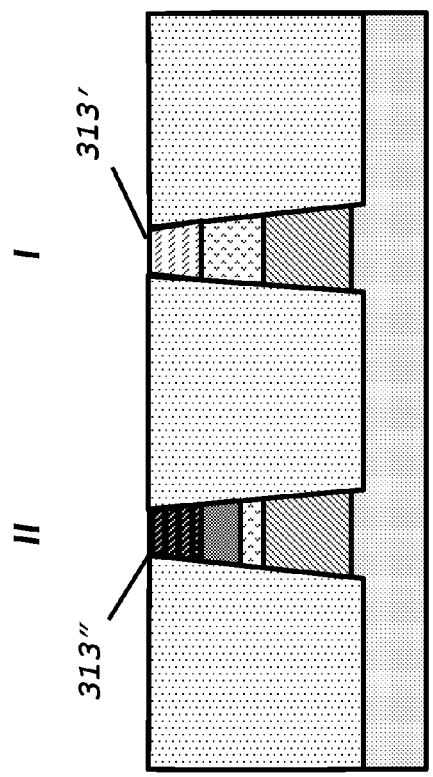
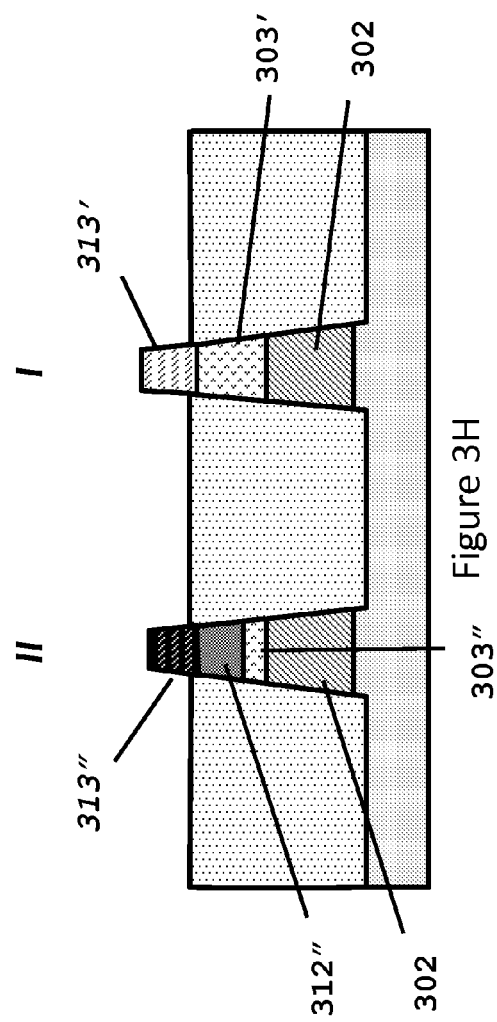

FINFET DEVICE WITH DUAL-STRAINED CHANNELS AND METHOD FOR MANUFACTURING THEREOF

CROSS-REFERENCE TO RELATED APPLICATIONS

This application claims priority under 35 U.S.C. §119(e) to U.S. Provisional Patent Application Ser. No. 61/733,641, filed on Dec. 5, 2012, and U.S. patent application Ser. No. 14/086,486, filed on Nov. 21, 2013, the full disclosures of which are incorporated herein by reference.

TECHNICAL FIELD

The present disclosure relates to transistor devices, more specifically to FinFET devices with dual-strained channels and method for manufacturing thereof.

BACKGROUND ART

Strain engineering refers to a general strategy employed in semiconductor manufacturing to enhance device performance. Performance benefits are achieved by modulating strain in the transistor channel, which enhances electron mobility (or hole mobility) and thereby conductivity through the channel.

One particular consideration in using strain engineering in CMOS technologies is that PMOS and NMOS respond differently to different types of strain. Specifically, PMOS performance is best served by applying compressive strain to the channel, whereas NMOS receives benefit from tensile strain. Different approaches to strain engineering induce strain locally, allowing both n-channel and p-channel strain to be modulated independently.

NFET and PFET thus require opposite strain for mobility enhancement. Therefore a mobility enhancement for one of the transistors can lead to degradation of performance for the other transistor. To avoid degradation of performance for one of the transistor types, or to obtain mobility enhancement for both at the same time is not straightforward.

One known approach involves the use of a strain-inducing capping layer. CVD silicon nitride is a common choice for a strained capping layer, in that the magnitude and type of strain (e.g. tensile versus compressive) may be adjusted by modulating the deposition conditions, especially temperature. Standard lithography patterning techniques can be used to selectively deposit strain-inducing capping layers, to deposit a compressive film over only the PMOS, for example.

Another way to tackle this is by performing multiple epitaxial growth steps of different types of strained-relaxed buffers and channels. However, the epitaxial growth steps need to be masked such as the growth is performed either on the nFET or on the pFET. These masking steps are both technically challenging and costly.

SUMMARY OF THE DISCLOSURE

In a first example aspect of the present disclosure, a method is disclosed for manufacturing a dual channel FinFET device having at least one channel subjected to a mobility enhancement strain in the as-grown state, the method comprising: providing a substrate (100) comprising at least two fin structures (I, II) separated by an isolation region (101), each of the fin structures in physical contact with a source region and a drain region, wherein each of the at least two fin structures (I, II) comprises an upper layer (110) suitable to form a n-type or p-type channel and a strained relaxed buffer (SRB) (102) underlying and in contact with said upper layer (110), and overlying and in contact with the substrate (100), wherein the composition of the upper layer (110) and the SRB (102) is selected such that the upper layer (110) of a first fin structure is subjected to a first mobility enhancing strain in the as-grown state, the first mobility enhancing strain being applied in a longitudinal direction from the source region to the drain region, performing an ion implantation in at least a part of the upper layer (110) of a second fin structure (II), thereby forming an amorphous layer (111), then performing a re-crystallization by laser anneal of the amorphous layer (111), thereby forming a strain-relaxed upper layer (112) of the second fin structure.

According to example embodiments, the first mobility enhancing strain is a compressive strain. The SRB can then comprise $Si_{1-x}Ge_x$ and the upper layer can comprise $Si_{1-y}Ge_y$, wherein y>x, 0<x<1 and 0<y≤1. In an example, 0.5≤x≤0.75 and y=1. Alternatively the SRB can comprise $Si_{1-w}C_w$ and the upper layer can comprise $Si_{1-y}Ge_y$, wherein 0<w≤0.1 and 0≤y≤0.25.

According to example embodiments, the first mobility enhancing strain is a tensile strain. The SRB can then comprise $Si_{1-x}Ge_x$ and the upper layer can comprise $Si_{1-y}Ge_y$, wherein y<x, 0<x<1 and 0≤y<1. In an example, 0.25≤x≤0.5 and y=0. Alternatively, the SRB comprises $Ge_{1-t}Sn_t$ and the upper layer comprises $Si_{1-y}Ge_y$, wherein 0<t≤0.1 and 0.75≤y≤1.

According to a second example aspect of the present disclosure, a method is disclosed for manufacturing a dual channel FinFET device having each channel subjected to a mobility enhancement strain, the method comprising providing a substrate (200, 300) comprising at least two fin structures (I, II) separated by an isolation region (201, 301), each of the fin structures in physical contact with a source region and a drain region, wherein each of the at least two fin structures (I, II) comprises a strained relaxed buffer (SRB) wherein the SRB comprises at least two layers, a SRB1 (202, 302) overlying and in contact with the substrate and a SRB2 (203, 303) overlying and in contact with SRB1 and a first upper layer (210) overlying and in contact with the SRB2 (203, 303), said first upper layer being suitable to form a n-type or p-type channel, wherein the composition of the first upper layer (210) and the SRB2 (203, 303) is selected such that the first upper layer of a first fin structure is subjected to a first mobility enhancing strain in the as-grown state, the first mobility enhancing strain being applied in a longitudinal direction from the source region to the drain region performing an ion implantation in the first upper layer (210) and at least an upper part of SRB2 (203, 303) of the second fin structure, thereby forming an amorphous buffer layer (211, 311), then performing a re-crystallization by laser anneal of the amorphous buffer layer (211, 311), thereby forming a strain-relaxed buffer layer (212 (not shown), 312) of the second fin structure, forming a recess in the second fin structure by removing part of the strain-relaxed buffer layer, thereby exposing a remaining strain-relaxed buffer layer (212' (not shown), 312"), then filling the recess in the second fin structure by epitaxial growth of an upper layer (213, 313") on the remaining strain-relaxed buffer layer (212' (not shown), 312"), wherein a composition of the upper layer (213, 313") is chosen such that the second upper layer is subjected to a second mobility enhancing strain in the as-grown state, the second mobility enhancing strain being applied in a longitudinal direction from the source region to the drain region.

According to example embodiments, the first upper layer (310 (not shown)) and SRB2 (303) have the same composition.

According to example embodiments, the method further comprises: simultaneously with forming a recess in the second fin structure forming a recess in the first fin structure thereby consuming the first upper layer and/or part of the SRB2 of the first fin structure and exposing a remaining SRB2 (303') and simultaneously with filling the recess in the second fin structure, filling the recess in the first fin structure by epitaxial growth of an upper layer (313", 313') on the remaining SRB2 (303'), wherein a composition of the upper layer is chosen such that the upper layer is subjected in the as-grown state to a second mobility enhancing strain in the second fin structure and to a first mobility enhancing strain in the first fin structure, wherein both the first and the second mobility enhancing strain being applied in a longitudinal direction from the source region to the drain region.

According to example embodiments, the second mobility enhancing strain is a compressive strain and the first mobility enhancing strain is a tensile strain. According to example embodiments, the SRB1 comprises $Si_{1-x}Ge_x$, SRB2 comprises $Si_{1-y}Ge_y$, and each of the upper layer and the first upper layer comprises $Si_{1-z}Ge_z$, wherein y<z<x, 0<x≤1, 0<y<1, 0<z<1. In an example, x=1, y=0.4 and z=0.7.

According to example embodiments, the SRB1 comprises $Si_{1-x}Ge_x$, SRB2 comprises $Si_{1-w}C_w$ and each of the upper layer and the first upper layer comprises $Si_{1-y}Ge_y$, wherein y<x, 0<x<1, 0≤y<1, and 0<w≤0.1.

According to alternative example embodiments, the SRB1 comprises $Ge_{1-t}Sn_t$, SRB2 comprises $Si_{1-x}Ge_x$ and each of the upper layer and the first upper layer comprises $Si_{1-y}Ge_y$, wherein y>x, 0<x<1, 0<y≤1, and 0<t≤0.1.

According to example embodiments, the second mobility enhancing strain is a tensile strain and the first mobility enhancing strain is a compressive strain. The SRB1 can comprise $Si_{1-x}Ge_x$, SRB2 can comprise $Si_{1-y}Ge_y$ and each of the upper layer and the first upper layer can comprise $Si_{1-z}Ge_z$, wherein x=0, 0<y<1, 0<z<1 and z<y.

According to example embodiments, the method further comprises partially recessing the isolation region such that the upper layer or the first upper layer of the first fin structure and the upper layer of the second fin structure are protruding from the substrate.

According to a third example aspect of the present disclosure, a dual channel FinFET device is disclosed having at least one channel subjected to a mobility enhancement strain, the device comprising a substrate (100) comprising at least two fin structures (I, II) separated by an isolation region (101), wherein each of the at least two fin structures is in physical contact with a source region and a drain region and wherein each of the at least two fin structures comprises a strain relaxed buffer (SRB) (102) overlying and in contact with the substrate and an upper layer (110) overlying and in contact with the SRB, said upper layer being suitable to form a n-type or p-type channel which is protruding from the substrate wherein the composition of the upper layer (110) and the SRB is selected such that the upper layer of a first fin structure is subjected to a first mobility enhancing strain in the as-grown state, the first mobility enhancing strain being applied in a longitudinal direction from the source region to the drain region and wherein at least an upper part (112) of the upper layer of a second fin structure is strain-relaxed.

According to example embodiments, the first mobility enhancing strain is a compressive strain. According to example embodiments, the SRB comprises $Si_{1-x}Ge_x$ and the upper layer comprises $Si_{1-y}Ge_y$, wherein y>x, 0<x≤1 and 0<y≤1. In an example, 0.5≤x≤0.75 and y=1. According to alternative example embodiments, the SRB comprises $Si_{1-w}C_w$ and the upper layer comprises $Si_{1-y}Ge_y$, wherein 0<w≤0.1 and 0≤y≤0.25.

According to example embodiments, the first mobility enhancing strain is a tensile strain.

According to example embodiments, the SRB comprises $Si_{1-x}Ge_x$ and the upper layer comprises $Si_{1-y}Ge_y$, wherein y<x, 0<x<1 and 0≤y<1. In an example, 0.25≤x≤0.5 and y=0.

According to alternative example embodiments, the SRB comprises $Ge_{1-t}Sn_t$ and the upper layer comprises $Si_{1-y}Ge_y$, wherein 0<t≤0.1 and 0.75≤y≤1.

According to a fourth example aspect of the present disclosure, a dual channel FinFET device is disclosed having each channel subjected to a mobility enhancement strain, the device comprising a substrate (200, 300) comprising at least two fin structures (I, II) separated by an isolation region (201, 301), wherein each of the at least two fin structures is in physical contact with a source region and a drain region and wherein each of the at least two fin structures (I, II) comprises a strain relaxed buffer (SRB) overlying and in contact with the substrate, wherein the SRB comprises at least two layers, a SRB1 (202, 302) overlying and in contact with the substrate and a SRB2 (203, 303) overlying and in contact with SRB1, wherein a first fin structure further comprises an first upper layer (210) overlying and in contact with the SRB2 (203), said first upper layer is protruding from the substrate and is suitable to form a n-type or p-type channel, wherein the composition of the first upper layer (210) and the SRB2 is selected such that the upper layer of a first fin structure is subjected to a first mobility enhancing strain in the as-grown state, the first mobility enhancing strain being applied in a longitudinal direction from the source region to the drain region, wherein an upper part of the SRB2 (212", 312") of a second fin structure is strain-relaxed and the second fin structure further comprises a upper layer (213, 313") overlying and in contact with said strain-relaxed upper part of SRB2 (212", 312"), the upper layer (213, 313") protruding from the substrate and being suitable to form a n-type or p-type channel wherein the composition of the upper layer (213, 313") is chosen such that the upper layer is subjected to a second mobility enhancing strain in the as-grown state, the second mobility enhancing strain being applied in a longitudinal direction from the source region to the drain region.

According to example embodiments, the first upper layer (313') of the first fin structure has the same composition as the upper layer (313") of the second fin structure.

According to example embodiments, the second mobility enhancing strain is a compressive strain and the first mobility enhancing strain is a tensile strain.

According to example embodiments, the SRB1 comprises $Si_{1-x}Ge_x$, SRB2 comprises $Si_{1-y}Ge_y$ and each of the first upper layer and the upper layer comprise $Si_{1-z}Ge_z$, wherein y<z<x, 0<x≤1, 0<y<1, 0<z<1. In an example, x=1, y=0.4 and z=0.7.

According to alternative example embodiments, the SRB1 comprises $Si_{1-x}Ge_x$, SRB2 comprises $Si_{1-w}C_w$ and each of the first upper layer and the upper layer comprise $Si_{1-y}Ge_y$, wherein y<x, 0<x<1, 0≤y<1, and 0<w≤0.1.

According to yet alternative example embodiments, the SRB1 comprises $Ge_{1-t}Sn_t$, SRB2 comprises $Si_{1-x}Ge_x$ and wherein each of the first upper layer and the upper layer comprise $Si_{1-y}Ge_y$, wherein y>x, 0<x<1, 0<y≤1, and 0<t≤0.1.

According to example embodiments, the second mobility enhancing strain is a tensile strain and the first mobility enhancing strain is a compressive strain.

According to example embodiments, the SRB1 comprises $Si_{1-x}Ge_x$, SRB2 comprises $Si_{1-y}Ge_y$, and each of the first upper layer and the upper layer comprise $Si_{1-z}Ge_z$, wherein x=0, 0<y<1, 0<z<1 and z<y.

In the above embodiments, the ion implantation process may be based on heavy atoms which do not cause doping of or electrical activity in the material to which the implantation is made. In an example, germanium atoms can be used as implantation species. Other implantation species can for instance be silicon atoms or suitable molecules. In an example, implantation energies are for instance between 1 keV and 200 keV. The implantation dose may, for example, be within 1e14 and 1e17 cm-2. In an example amorphizing implantation process, Germanium atoms can be used, with an implantation energy of 35 keV and with an implantation dose of 1e15 cm-2.

According to example embodiments, the implantation process results in an upper portion of a respective layer being amorphised for more than 50%, or more than 60%, or more than 70%, or more than 80%, or more than 90%. Thereby, in an example, a lower portion of the layer which is subjected to the atom or molecule implantation may be unaffected by the implantation. This lower portion can be complementary to the upper portion, and can, for example, have a thickness in between 2 nm and 20 nm.

According to example embodiments of the present disclosure, the amorphous layer formed by ion implantation is selectively annealed by applying a laser anneal step. In an example, the wavelength of the laser anneal is adapted such that the energy is absorbed by the amorphous regions and not by the crystalline regions. The wavelength of the laser anneal may be adapted such that the energy is absorbed by the amorphous regions only. Amorphous silicon has a lower melting point than crystalline silicon. When a laser pulse is given having appropriate parameters or settings, it is possible to melt the amorphous silicon while leaving the crystalline silicon intact, for instance in the same die.

The wavelength laser used for the laser anneal can range for instance from the infra-red in the order of 1060 nm down to Ultra-Violet wavelengths of 351 nm down to 157 nm. The laser used may be a pulsed laser. It may, for example, have laser pulses with a duration of 10 to 50 ns. In an example, pulse energy may be within the range of 0.01 to 10 J/cm2. An example value can be or can be about 0.2 J/cm2.

The pulse repetition rate may, for example, lie within the range of 10 ms to 10 seconds. An example value can be or can be about 0.5 second. Any pulsed laser system could be used, either with or without Q-switching.

The laser pulse having appropriate parameters or settings as described above, can for instance be obtained with pulsed laser systems, being for instance Nd:YAG or excimer laser systems. State of the art equipment in the semiconductor industry has an illumination field that covers the whole die in one single pulse.

Typical pulse length for a YAG in green light (wavelength 532 nm) is 25 ns (Q-switching), or a multiple thereof (50 ns, 75 ns, . . . ). Pulse energies up to about or up to 1 J/cm2 can be used, depending on the application and emissivity of the surface.

As an example, a blank silicon wafer shows melt starting at 240 mJ/cm2 for a YAG laser with wavelength of 532 nm and pulse length of 25 ns. By adjusting the energy the melt depth can be very accurately tuned, within the precision of about 1 nm. Possibly pulse repetition can be applied at a rate of 0.5 s.

For an excimer laser radiating in UV the pulse length is typically about 150 ns, generated by electric pulse discharge. Pulse energies up to 3 J/cm2 can be used, depending on the application and emissivity of the surface. As an example a blank silicon wafer shows melt starting at 1.75 J/cm2 for a Xe*Cl excimer laser with wavelength of 308 nm and pulse length of 150 ns. By adjusting the energy the melt depth can be very accurately tuned, within the precision of about 1 nm. Possibly pulse repetition can be applied at a rate of 0.1 s.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

Various exemplary embodiments are described herein with reference to the following drawings, wherein like numerals denote like entities.

All drawings are intended to illustrate some aspects and embodiments of the present disclosure. The drawings described are only schematic and are non-limiting.

FIGS. 1A to 1F show schematically an example of the process flow for manufacturing a device according to an example first embodiment of the disclosure.

FIGS. 2A to 2F show schematically an example of the process flow for manufacturing a device according to an example second embodiment of the disclosure.

FIGS. 3A to 3H show schematically an example of the process flow for manufacturing a device according to an example third embodiment of the disclosure.

DETAILED DESCRIPTION OF EXAMPLE EMBODIMENTS

Figure 1A:
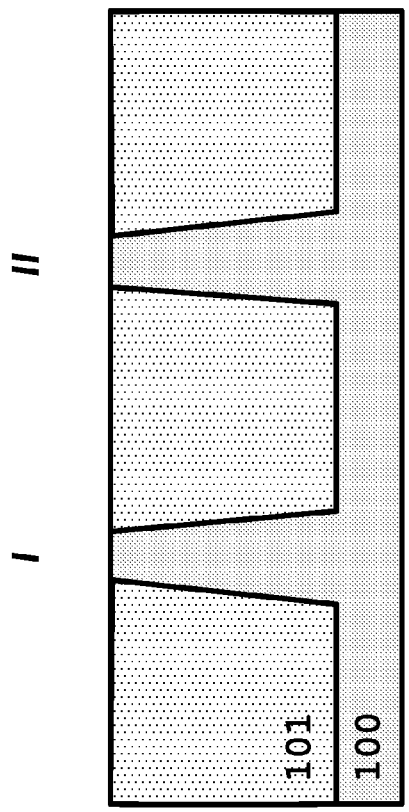

The present disclosure relates to a dual channel FinFET device, wherein at least one of the channels is subjected to a mobility enhancement strain and to a method of manufacturing thereof.

Furthermore the disclosure relates to a dual channel FinFET device, wherein each of the channels is subjected to a mobility enhancement strain and to a method of manufacturing thereof.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions may not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may.

Furthermore, the particular features, structures or characteristics may be combined in any suitable manner, as would be apparent to one of ordinary skill in the art from this disclosure, in one or more embodiments.

Furthermore, while some embodiments described herein include some but not other features included in other embodiments, combinations of features of different embodiments are meant to be within the scope of the disclosure, and form different embodiments, as would be understood by those in the art.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In general, when a first layer is overlying and in contact with a second layer, a tensile strain is induced in the first layer when the lattice of the first layer is stretched to mimic a larger lattice constant of the second layer. Conversely, compressive strain is induced when the second layer has a smaller lattice constant.

Throughout the disclosure a dual channel FinFET is a device containing two FinFETs, one FinFET with a p-type channel (NFET) and another FinFET with an n-type channel (PFET).

An example aspect the present disclosure relates to a method for manufacturing a dual channel FinFET device, wherein at least one of the channels is subjected to a mobility enhancement strain in the as-grown state. Further, embodiments of the first aspect relate to a method for manufacturing a dual channel FinFET device, wherein each of the channels (both channels) are subjected to a mobility enhancement strain in the as-grown state.

A first embodiment of the first aspect relates to a method for manufacturing a dual channel FinFET device, wherein at least one of the channels in subjected to a mobility enhancement strain in the as-grown state, the method comprising: providing a substrate (100) comprising at least two fin structures (I, II) separated by an isolation region (101), each of the fin structures in physical contact with a source region and a drain region. Each of the at least two fin structures (I, II) comprises an upper layer (110) suitable to form an n-type or p-type channel and a strained relaxed buffer (SRB) (102) underlying and in contact with said upper layer (110), and overlying and in contact with the substrate (100). The composition of the upper layer (110) and the SRB (102) is selected such that the upper layer (110) of a first fin structure is subjected to a first mobility enhancing strain in the as-grown state, the first mobility enhancing strain being applied in a longitudinal direction from the source region to the drain region; performing an ion implantation in at least a part of the upper layer (110) of a second fin structure (II), thereby forming an amorphous layer (111); then performing a re-crystallization by laser anneal of the amorphous layer (111), thereby forming a substantially relaxed upper layer (112) of the second fin structure.

In different embodiments of the disclosure the substrate comprises a material compatible with semiconductor manufacturing. The substrate comprises a semiconductor material such as Si or Ge. The substrate can, for example, be made of silicon, silicon on insulator, germanium on insulator.

Figure 5:
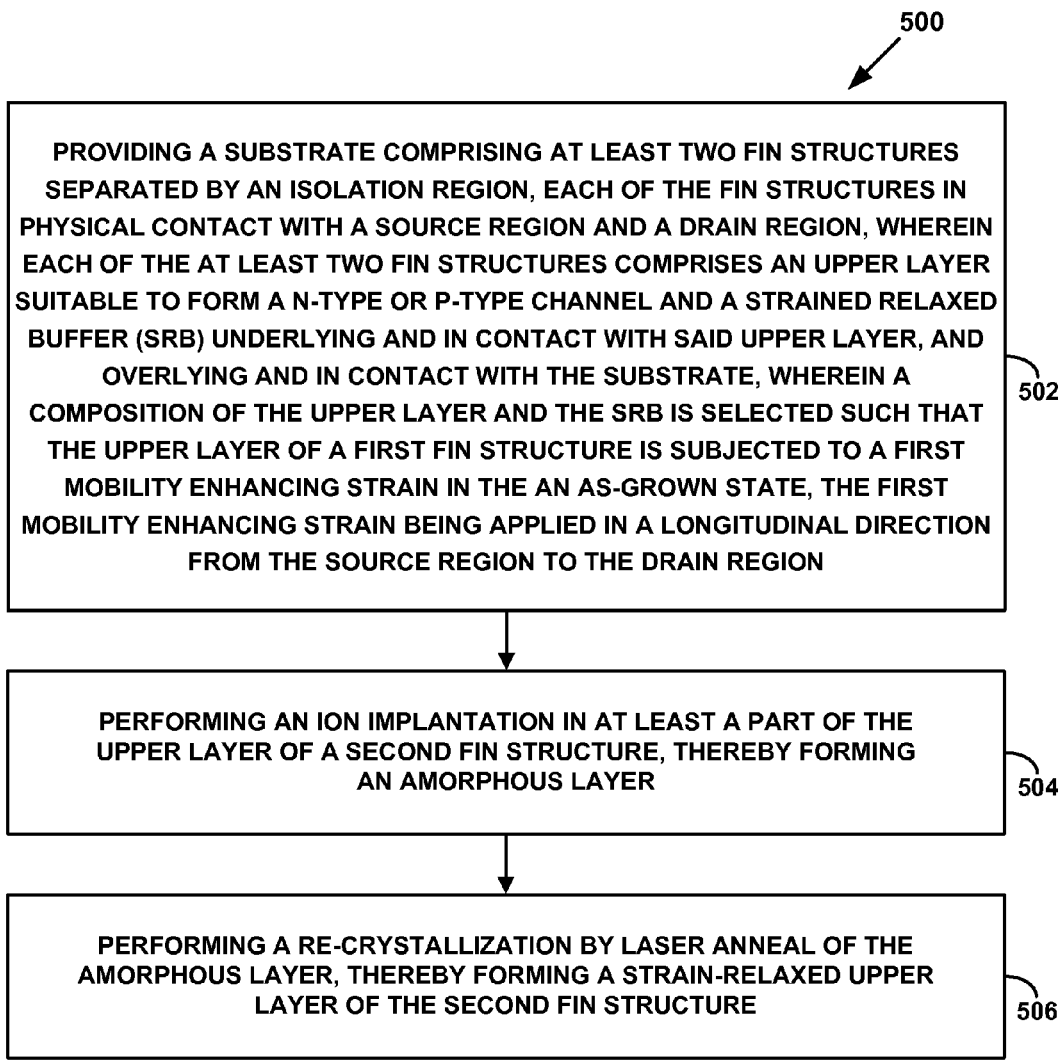
FIG. 5 illustrates an example method in accordance with an example of the present disclosure.

FIG. 5 depicts an example method 500 according to an example of the first embodiment. The method 500 includes: at step 502 providing a substrate comprising at least two fin structures separated by an isolation region, each of the fin structures in physical contact with a source region and a drain region, wherein each of the at least two fin structures comprises an upper layer suitable to form a n-type or p-type channel and a strained relaxed buffer (SRB) underlying and in contact with said upper layer, and overlying and in contact with the substrate, wherein a composition of the upper layer and the SRB is selected such that the upper layer of a first fin structure is subjected to a first mobility enhancing strain in the an as-grown state, the first mobility enhancing strain being applied in a longitudinal direction from the source region to the drain region; at step 504, performing an ion implantation in at least a part of the upper layer of a second fin structure, thereby forming an amorphous layer; then at step 506, performing a re-crystallization by laser anneal of the amorphous layer, thereby forming a strain-relaxed upper layer of the second fin structure.

A schematic representation of a process manufacturing flow according to an example of the first embodiment is shown in FIG. 1A to 1F.

Figure 1B:
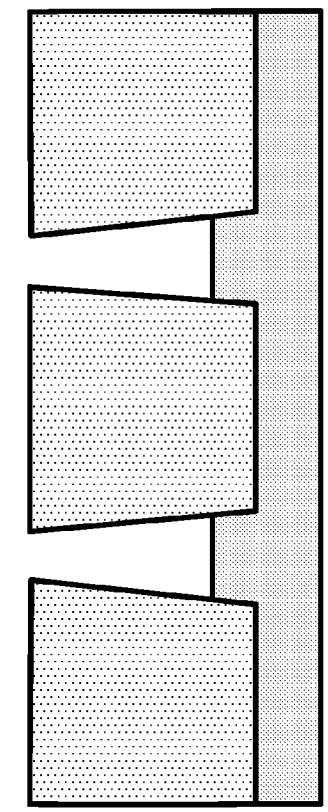

The SRB and the upper layer can be formed by epitaxial growth in pre-defined trenches (FIG. 1A, 1B). These trenches are exposing the substrate material (100) at the bottom and have walls made of an insulator (dielectric) material (101). A shallow trench isolation (STI) pattern may be first defined on a substrate such that insulation regions are formed in between two active areas. Then the active areas are recessed up a depth approximately equal to the thickness of the isolation area to form the trenches wherein the SRB and the subsequent layers can be grown. This method takes advantage of growing the SRB and the upper layers in high-aspect ratio trenches and has the advantage of trapping the dislocation defects during the epitaxial growth thereby improve the crystalline quality of the grown material.

Figure 4:
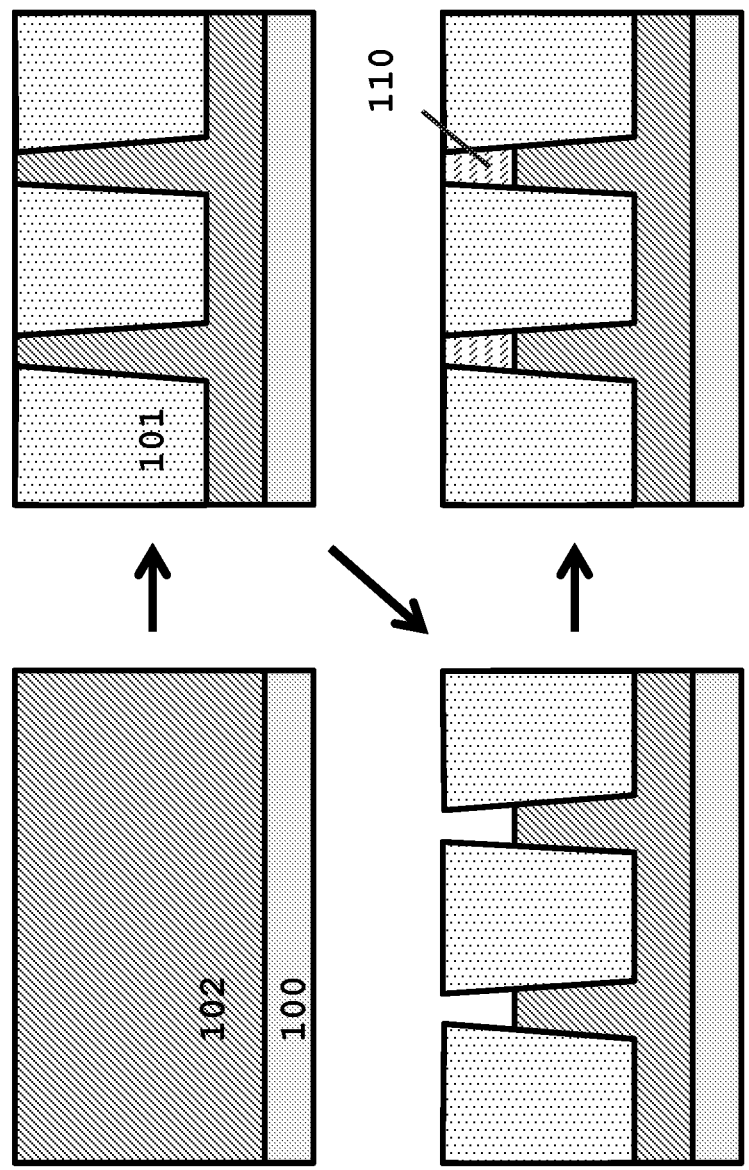
FIG. 4 shows schematically an example of process flow for manufacturing a device according to different example embodiments of the disclosure.

Alternatively, in different embodiments of the disclosure, instead of growing the SRB in trenches, the SRB (102) can be grown first on a blanket substrate (100) and then the STI pattern is formed in the SRB, as schematically represented in FIG. 4. The SRB-material left in between two isolation areas is subsequently partially recessed to form trenches having a reduced depth. In these reduced depth trenches a second relaxed buffer layer and/or the upper layers (110) that will form the channels of the FinFET device are subsequently formed by epitaxial growth.

In different embodiments of the disclosure, exposing the upper layer of the second fin structure to an ion implantation leads to converting the crystalline layer into an amorphous layer. The exposure of the second fin structure is performed while masking the first fin structure with an e.g. photoresist mask (120) as shown in FIG. 1D. The depth of the amorphization or the thickness of the amorphous layer formed (111) can be controlled by adapting the ion implantation process parameters such as the mass of the implanted species, the energy and dose. In an example the amorphization implant was performed with Ge at 100 keV and $1e^{15}$ cm$^{-2}$ dose.

The amorphous layer (111, FIG. 1D) formed by ion implantation is thereafter selectively annealed by applying a laser anneal. In an example, the wavelength of the laser anneal is adapted such that the energy is absorbed by the amorphous regions and not by the crystalline regions. In an example, the wavelength of the laser anneal is adapted such that the energy is absorbed by the amorphous regions only.

The wavelength laser used for the laser anneal can range for instance from the infra-red in the order of 1060 nm down to Ultra-Violet wavelengths of 351 nm down to 157 nm. The laser used may be a pulsed laser with laser pulses with a duration of 10 to 50 ns.

Consequently only the amorphous regions are annealed, while crystalline regions remain substantially unaffected. By annealing, the amorphous layer is re-crystallized into a strain-relaxed layer, referred herein further as strain-relaxed upper layer (112, FIG. 1E). The strain-relaxed upper layer overlies the SRB. By performing this selective anneal, process integration schemes are possible wherein the correct strain (for mobility enhancement) is obtained for both NFET and PFET while limiting the number of epitaxial growth steps.

In embodiments of the disclosure the SRB or a sub-layer of it as well as an upper layer formed on the SRB may further comprise dopants. For example, dopant elements such as P, As, or B are used for short-channel control and for source/drain formation. The latter requires the highest doping level, up to $5e^{21}$ cm$^{-3}$.

In examples of the first embodiment wherein the first mobility enhancing strain is a compressive strain, the SRB comprises $Si_{1-x}Ge_x$ and the upper layer comprises $Si_{1-y}Ge_y$, wherein y>x, 0<x<1 and 0<y≤1. In specific embodiments of the first aspect wherein the first mobility enhancing strain is a compressive strain, the SRB comprises $Si_{1-x}Ge_x$ and the upper layer comprises $Si_{1-y}Ge_y$, wherein 0.5≤x≤0.75 and y=1. Thus in specific embodiments the SRB is made of Ge-rich $Si_{1-x}Ge_x$ with 0.5≤x≤0.75 and the upper layer is made of Ge.

In alternative examples of the first embodiment wherein the first mobility enhancing strain is a compressive strain, the SRB comprises $Si_{1-w}C_w$ and the upper layer comprises $Si_{1-y}Ge_y$, wherein 0<w≤0.1 and 0≤y≤0.25. In specific embodiments the SRB is made of $Si_{1-w}C_w$ with low amount of C 0<w≤0.1 and the upper layer is made of Si-rich $Si_{1-y}Ge_y$ with 0≤y≤0.25.

In examples of the first embodiment wherein the first mobility enhancing strain is a tensile strain, the SRB comprises $Si_{1-x}Ge_x$ and the upper layer comprises $Si_{1-y}Ge_y$, wherein y<x, 0<x<1 and 0≤y<1. In specific embodiments of the first aspect wherein the first mobility enhancing strain is a tensile strain, the SRB comprises $Si_{1-x}Ge_x$ and the upper layer comprises $Si_{1-y}Ge_y$, wherein 0.25≤x≤0.5 and y=0. Thus in specific embodiments the SRB is made of Si-rich $Si_{1-x}Ge_x$ with 0.25≤x≤0.5 and the upper layer is made of Si.

In alternative examples of the first embodiment wherein the first mobility enhancing strain is a tensile strain, the SRB comprises $Ge_{1-t}Sn_t$ and the upper layer comprises $Si_{1-y}Ge_y$, wherein 0<t≤0.1 and 0.75≤y≤1. In specific embodiments the SRB is made of $Ge_{1-t}Sn_t$ with low amount of Sn 0<t≤0.1 and the upper layer is made of Ge-rich $Si_{1-y}Ge_y$ with 0.75≤y≤1.

In an example second embodiment of the first aspect the present disclosure relates to a method for manufacturing a dual channel FinFET device, wherein each of the channels is subjected to a mobility enhancement strain, the method comprising: providing a substrate (200, 300) comprising at least two fin structures (I, II) separated by an isolation region (201, 301), each of the fin structures in physical contact with a source region and a drain region, wherein each of the at least two fin structures (I, II) comprises a strained relaxed buffer (SRB). The SRB comprises at least two layers, a SRB1 (202, 302) overlying and in contact with the substrate and a SRB2 (203, 303) overlying and in contact with SRB1. Further each of the at least two fin structures (I, II) comprises a first upper layer (210) overlying and in contact with the SRB2 (203, 303), the first upper layer being suitable to form an n-type or p-type channel. The composition of the first upper layer (210) and the SRB2 (203, 303) is selected such that the first upper layer of a first fin structure is subjected to a first mobility enhancing strain in the as-grown state, the first mobility enhancing strain being applied in a longitudinal direction from the source region to the drain region; performing an ion implantation in the first upper layer (210) and at least an upper part of SRB2 (203, 303) of the second fin structure, thereby forming an amorphous buffer layer (211, 311); thereafter followed by performing a re-crystallization by laser anneal of the amorphous buffer layer (211, 311), thereby forming a strain-relaxed buffer layer (212 (not shown), 312) of the second fin structure; then followed by forming a recess in the second fin structure by removing part of the strain-relaxed buffer layer, thereby exposing a remaining strain-relaxed buffer layer (212'(not shown), 312"); followed by filling the recess in the second fin structure by epitaxial growth of a upper layer (213, 313") on the remaining strain-relaxed buffer layer (212' (not shown), 312"), wherein a composition of the upper layer (213, 313) is chosen such that the second upper layer is subjected to a second mobility enhancing strain in the as-grown state, the second mobility enhancing strain being applied in a longitudinal direction from the source region to the drain region.

Figure 6:
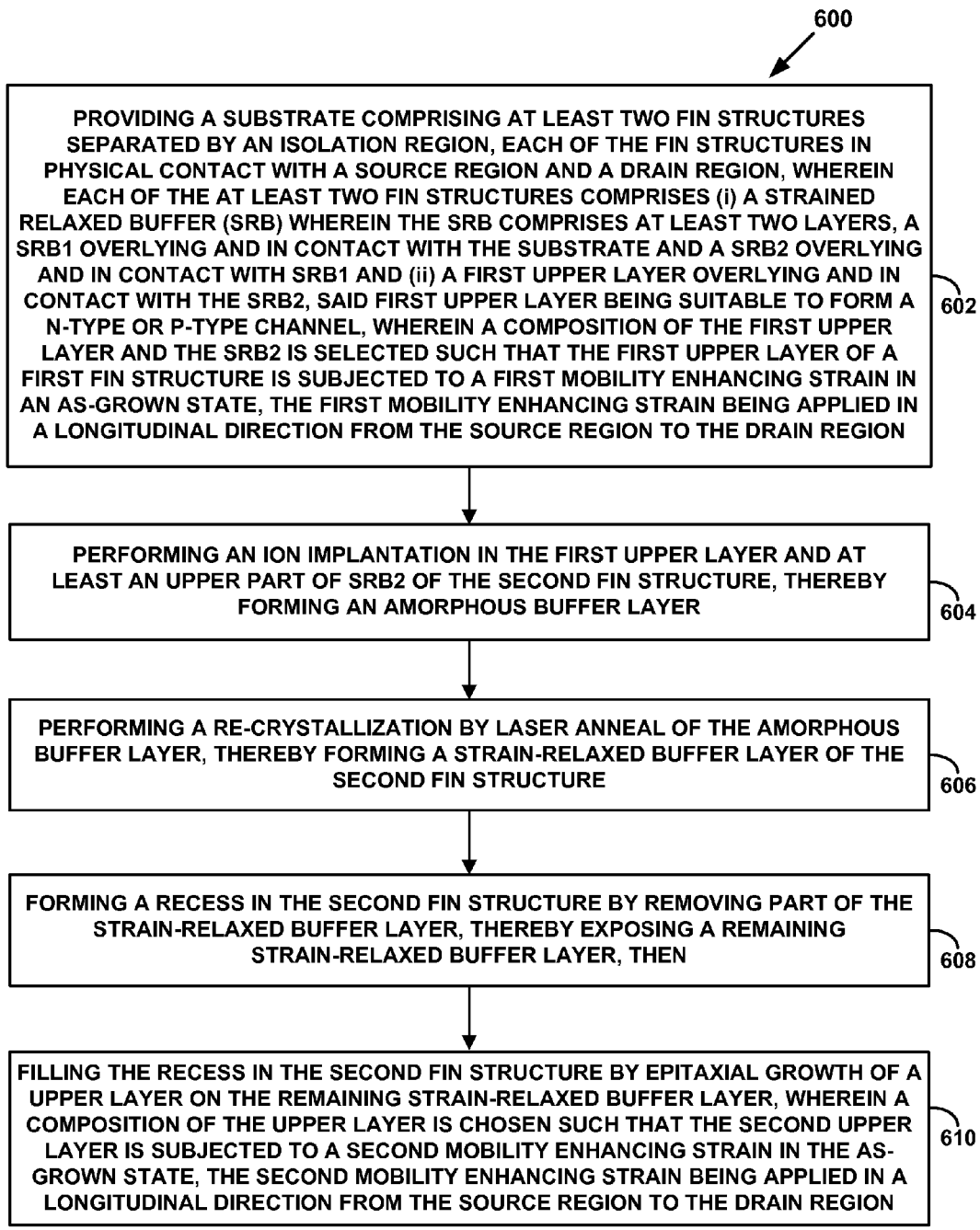
FIG. 6 illustrates another example method in accordance with an example of the present disclosure.

FIG. 6 depicts an example method 600 according to an example of the second embodiment. The method 600 includes: at step 602, providing a substrate comprising at least two fin structures separated by an isolation region, each of the fin structures in physical contact with a source region and a drain region, wherein each of the at least two fin structures comprises (i) a strained relaxed buffer (SRB) wherein the SRB comprises at least two layers, a SRB1 overlying and in contact with the substrate and a SRB2 overlying and in contact with SRB1 and (ii) a first upper layer overlying and in contact with the SRB2, said first upper layer being suitable to form an n-type or p-type channel, wherein a composition of the first upper layer and the SRB2 is selected such that the first upper layer of a first fin structure is subjected to a first mobility enhancing strain in an as-grown state, the first mobility enhancing strain being applied in a longitudinal direction from the source region to the drain region; at step 604, performing an ion implantation in the first upper layer and at least an upper part of SRB2 of the second fin structure, thereby forming an amorphous buffer layer; then at step 606, performing a re-crystallization by laser anneal of the amorphous buffer layer, thereby forming a strain-relaxed buffer layer of the second fin structure; at step 608, forming a recess in the second fin structure by removing part of the strain-relaxed buffer layer, thereby exposing a remaining strain-relaxed buffer layer; then at step 610, filling the recess in the second fin structure by epitaxial growth of a upper layer on the remaining strain-relaxed buffer layer, wherein a composition of the upper layer is chosen such that the second upper layer is subjected to a second mobility enhancing strain in the as-grown state, the second mobility enhancing strain being applied in a longitudinal direction from the source region to the drain region.

A schematic representation of a process manufacturing flow according to an example of the second embodiment is shown in FIG. 2A to 2F.

Figure 3A:
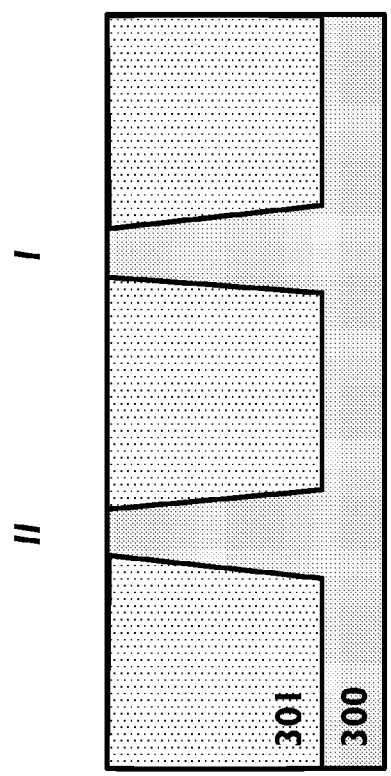
Figure 3B:
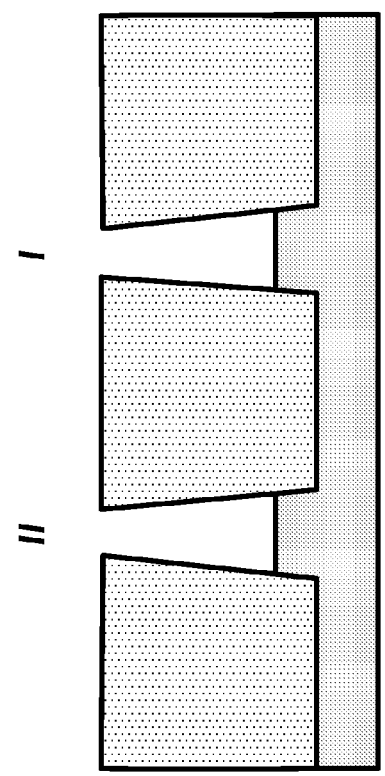
Figure 3C:
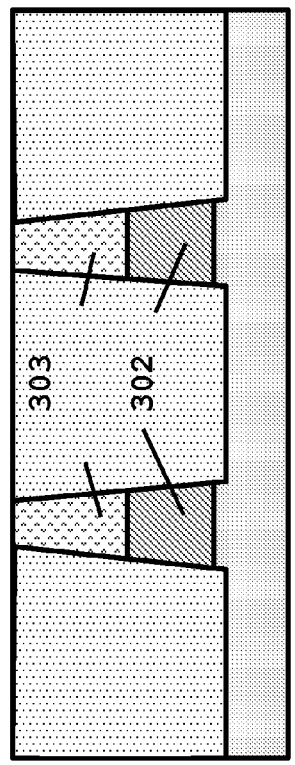

In an example third embodiment of the first aspect the present disclosure relates to a method for manufacturing a dual channel FinFET device similar with the method described in the second embodiment and wherein the first upper layer (310 (not shown)) and the SRB2 (303) have the same composition as illustrated in FIG. 3C. In addition the method of the third embodiment may further comprise: simultaneously with forming a recess in the second fin structure forming a recess in the first fin structure thereby consuming the first upper layer and/or part of the SRB2 of the first fin structure and exposing a remaining SRB2 (303') and simultaneously with filling the recess in the second fin structure, filling the recess in the first fin structure by epitaxial growth of an upper layer (313", 313') on the remaining SRB2 (303'), wherein a composition of the upper layer is chosen such that the upper layer is subjected in the as-grown state to a second mobility enhancing strain in the second fin structure and to a first mobility enhancing strain in the first fin structure, wherein both the first and the second mobility enhancing strain being applied in a longitudinal direction from the source region to the drain region.

A schematic representation of a process manufacturing flow according to an example of the third embodiment is shown in FIG. 3A to 3H.

In examples of the second and third embodiment of the disclosure wherein the second mobility enhancing strain is a compressive strain and the first mobility enhancing strain is a tensile strain, the SRB1 comprises $Si_{1-x}Ge_x$, SRB2 comprises $Si_{1-y}Ge_y$, and each of the upper layer and the first upper layer comprises $Si_{1-z}Ge_z$, wherein y<z<x, 0<x≤1, 0<y<1, 0<z<1.

In the third embodiment the first upper layer has the same chemical composition with the SRB2. In the third embodiment the first upper layer is removed from the first fin structure and an upper layer is grown in the place at the same time with growing the upper layer on the second fin structure.

In specific examples of the second and third embodiment of the disclosure wherein the second mobility enhancing strain is a compressive strain and the first mobility enhancing strain is a tensile strain, the SRB1 comprises $Si_{1-x}Ge_x$, SRB2 comprises $Si_{1-y}Ge_y$, and each of the upper layer and the first upper layer comprises $Si_{1-z}Ge_z$, wherein x=1, y=0.4 and z=0.7. In further specific examples the SRB1 is made of Ge, SRB2 is made of Si-rich $Si_{1-y}Ge_y$ with y=0.4, while the upper layer and the first upper layer are made of Ge-rich $Si_{1-z}Ge_z$, with z=0.7.

In alternative examples of the second and third embodiment of the disclosure wherein the second mobility enhancing strain is a compressive strain and the first mobility enhancing strain is a tensile strain, the SRB1 comprises $Si_{1-x}Ge_x$, SRB2 comprises $Si_{1-w}C_w$, while the upper layer and the first upper layer comprises $Si_{1-y}Ge_y$, wherein y<x, 0<x<1, 0≤y<1, and 0<w≤0.1. In specific examples SRB1 is made of $Si_{1-x}Ge_x$, SRB2 is made of $Si_{1-w}C_w$ with low amount of C (0<w≤0.1.) while the upper layer and the first upper layer are made of $Si_{1-y}Ge_y$ with lower Ge concentration than SRB1 (y<x) and 0<x<1, 0≤y<1.

In alternative examples of the second and third embodiment of the disclosure wherein the second mobility enhancing strain is a compressive strain and the first mobility enhancing strain is a tensile strain, SRB1 comprises $Ge_{1-t}Sn_t$, SRB2 comprises $Si_{1-x}Ge_x$ and each of the upper layer and the first upper layer comprises $Si_{1-y}Ge_y$, wherein y>x, 0<x<1, 0<y≤1, and 0<t≤0.1. In specific examples SRB1 is made of $Ge_{1-t}Sn_t$ with low amount of Sn (0<t≤0.1), SRB2 is made of $Si_{1-x}Ge_x$ and each of the upper layer and the first upper layer is made of $Si_{1-y}Ge_y$ with a higher amount of Ge than SRB2 (y>x) and 0<x<1, 0<y≤1.

In examples of the second and third embodiment of the disclosure wherein the second mobility enhancing strain is a tensile strain and the first mobility enhancing strain is a compressive strain, SRB1 comprises $Si_{1-x}Ge_x$, SRB2 comprises $Si_{1-y}Ge_y$, and each of the upper layer and the first upper layer comprises $Si_{1-z}Ge_z$, wherein x=0, 0<y<1, 0<z<1 and z<y. In further specific examples of the second and third embodiment of the disclosure wherein the second mobility enhancing strain is a tensile strain and the first mobility enhancing strain is a compressive strain, SRB1 is made of Si, SRB2 is made of $Si_{1-y}Ge_y$ and each of the upper layer and the first upper layer is made of $Si_{1-z}Ge_z$ with a lower amount if Ge than SRB2, wherein 0<y<1, 0<z<1 and z<y.

Further the first, second and third embodiments of the first aspect of the disclosure may further comprise: partially recessing the isolation region such that the upper layer (or the first upper layer, depending on the embodiment) of the first fin structure and the relaxed upper layer (or the upper layer, depending on the embodiment) of the second fin structure are protruding from the substrate. In further processing steps a gate oxide and a gate electrode can be formed around the protruding structures.

In a further example aspect, the present disclosure relates to a dual channel FinFET device with at least one channels subjected to a mobility enhancing strain. Further in the second aspect the present disclosure relates to a dual channel FinFET device having each of the channels subjected to a mobility enhancing strain.

In an example first embodiment of the second aspect the present disclosure relates to a dual channel FinFET device with at least one channels subjected to a mobility enhancing strain, the device comprising: a substrate (100) comprising at least two fin structures (I, II) separated by an isolation region (101), wherein each of the at least two fin structures is in physical contact with a source region and a drain region. Each of the at least two fin structures comprises a strain relaxed buffer (SRB) (102) overlying and in contact with the substrate and an upper layer (110) overlying and in contact with the SRB, said upper layer being suitable to form a n-type or p-type channel which is protruding from the substrate. The composition of the upper layer (110) and the SRB is selected such that the upper layer of a first fin structure is subjected to a first mobility enhancing strain in the as-grown state, the first mobility enhancing strain being applied in a longitudinal direction from the source region to the drain region and wherein at least an upper part (112) of the upper layer of a second fin structure is strain-relaxed.

The strain is present in the channel, i.e. in the as-deposited layer (also referred to as-grown state) is suitable to form a channel, meaning that the strain is not induced by depositing further layers on said channel, nor as a result of any post processing.

In examples of the first embodiment of the second aspect wherein the first mobility enhancing strain is a compressive strain, the SRB comprises $Si_{1-x}Ge_x$ and the upper layer comprises $Si_{1-y}Ge_y$, wherein y>x, 0<x≤1 and 0<y≤1. In specific embodiments of the third aspect wherein the first mobility enhancing strain is a compressive strain, the SRB comprises $Si_{1-x}Ge_x$ and the upper layer comprises $Si_{1-y}Ge_y$, wherein $0.5 \leq x \leq 0.75$ and $y=1$. Thus in specific embodiments the SRB is made of Ge-rich $Si_{1-x}Ge_x$ with $0.5 \leq x \leq 0.75$ and the upper layer is made of Ge.

In alternative examples of the first embodiment of the second aspect, wherein the first mobility enhancing strain is a compressive strain, the SRB comprises $Si_{1-w}C_w$ and the upper layer comprises $Si_{1-y}Ge_y$, wherein $0<w<0.1$ and $0<y \leq 0.25$. In specific examples the SRB is made of $Si_{1-w}C_w$ with low amount of C with $0<w \leq 0.1$ and the upper layer is made of Si-rich $Si_{1-y}Ge_y$ with $0 \leq y \leq 0.25$.

In examples of the first embodiment of the second aspect wherein the first mobility enhancing strain is a tensile strain, the SRB comprises $Si_{1-x}Ge_x$ and the upper layer comprises $Si_{1-y}Ge_y$, wherein $y<x$, $0<x<1$ and $0 \leq y<1$. In specific examples of the third aspect wherein the first mobility enhancing strain is a tensile strain, the SRB comprises $Si_{1-x}Ge_x$ and the upper layer comprises $Si_{1-y}Ge_y$, wherein $0.25 \leq x \leq 0.5$ and $y=0$. Thus in specific examples the SRB is made of Si-rich $Si_{1-x}Ge_x$ with $0.25 \leq x \leq 0.5$ and the upper layer is made of Si.

In alternative examples of the first embodiment of the second aspect wherein the first mobility enhancing strain is a tensile strain, the SRB comprises $Ge_{1-t}Sn_t$ and the upper layer comprises $Si_{1-y}Ge_y$, wherein $0<t \leq 0.1$ and $0.75 \leq y \leq 1$. In specific examples the SRB is made of $Ge_{1-t}Sn_t$ with low amount of Sn $0<t \leq 0.1$ and the upper layer is made of Ge-rich $Si_{1-y}Ge_y$ with $0.75 \leq y \leq 1$.

In a second and a third example embodiment of the second aspect a dual channel FinFET device with each of the channels subjected to a mobility enhancing strain, the device comprises: A substrate (200, 300) comprising at least two fin structures (I, II) separated by an isolation region (201, 301), wherein each of the at least two fin structures is in physical contact with a source region and a drain region. Each of the at least two fin structures (I, II) comprises a strain relaxed buffer (SRB) overlying and in contact with the substrate, wherein the SRB comprises at least two layers, a SRB1 (202, 302) overlying and in contact with the substrate and a SRB2 (203, 303) overlying and in contact with SRB1; a first fin structure further comprises an first upper layer (210) overlying and in contact with the SRB2 (203), said first upper layer is protruding from the substrate and is suitable to form a n-type or p-type channel, wherein the composition of the first upper layer (210) and the SRB2 is selected such that the upper layer of a first fin structure is subjected to a first mobility enhancing strain in the as-grown state, the first mobility enhancing strain being applied in a longitudinal direction from the source region to the drain region, an upper part of the SRB2 (212", 312") of a second fin structure is strain-relaxed and the second fin structure further comprises a upper layer (213, 313") overlying and in contact with said strain-relaxed upper part of SRB2 (212", 312"), the upper layer (213, 313") protruding from the substrate and being suitable to form a n-type or p-type channel; the composition of the upper layer (213, 313") is chosen such that the upper layer is subjected to a second mobility enhancing strain in the as-grown state, the second mobility enhancing strain being applied in a longitudinal direction from the source region to the drain region.

In a third embodiment the first upper layer (313') of the first fin structure has the same composition as the upper layer (313") of the second fin structure.

The upper layer (313') of the first fin structure is grown epitaxially at the same time with the upper layer (313") of the second fin structure in the recess formed in the first fin structure by removing the first upper layer (310 (not shown)) and/or part of SRB2 thereby exposing a remaining SRB2 (303'). The recess in the first fin structure may be formed at the same time with the recess in the second fin structure.

In examples of the second and third embodiment of the second aspect wherein the second mobility enhancing strain is a compressive strain and the first mobility enhancing strain is a tensile strain, SRB1 comprises $Si_{1-x}Ge_x$, SRB2 comprises $Si_{1-y}Ge_y$ and each of the first upper layer and the upper layer comprise $Si_{1-x}Ge_x$, wherein $y<z<x$, $0<x \leq 1$, $0<y<1$, $0<z<1$.

In specific examples of the second and third embodiment of the second aspect of the disclosure wherein the second mobility enhancing strain is a compressive strain and the first mobility enhancing strain is a tensile strain, SRB1 comprises $Si_{1-x}Ge_x$, SRB2 comprises $Si_{1-y}Ge_y$, while each of the upper layer and the first upper layer comprises $Si_{1-z}Ge_z$, wherein $x=1$, $y=0.4$ and $z=0.7$. In further specific examples the SRB1 is made of Ge, SRB2 is made of Si-rich $Si_{1-y}Ge_y$ with $y=0.4$ and the upper layer (or the first upper layer, depending on the embodiment) is made of Ge-rich $Si_{1-z}Ge_z$, with $z=0.7$.

In alternative examples of the second and third embodiment wherein the second mobility enhancing strain is a compressive strain and the first mobility enhancing strain is a tensile strain, SRB1 comprises $Si_{1-x}Gex$, SRB2 comprises $Si_{1-w}C_w$ while each of the first upper layer and the upper layer comprises $Si_{1-z}Ge_y$, wherein $y<x$, $0<x<1$, $0 \leq y<1$, and $0<w \leq 0.1$. In specific examples SRB1 is made of $Si_{1-x}Ge_x$, SRB2 is made of $Si_{1-w}C_w$, with low amount of C ($0<w \leq 0.1$.) while the first upper layer and the upper layer are made of $Si_{1-y}Ge_y$ with lower Ge concentration than SRB1 ($y<x$) and $0<x<1$, $0 \leq y<1$.

In alternative examples of the second and third embodiment of the disclosure wherein the second mobility enhancing strain is a compressive strain and the first mobility enhancing strain is a tensile strain, SRB1 comprises $Ge_{1-t}Sn_t$, SRB2 comprises $Si_{1-x}Gex$ and each of the first upper layer and the upper layer comprises $Si_{1-y}Ge_y$, wherein $y>x$, $0<x<1$, $0<y \leq 1$, and $0<t \leq 0.1$. In specific examples SRB1 is made of $Ge_{1-t}Sn_t$ with low amount of Sn ($0<t \leq 0.1$), SRB2 is made of $Si_{1-x}Ge_x$ and wherein each of the first upper layer and the upper layer is made of $Si_{1-y}Ge_y$ with a higher amount of Ge than SRB2 ($y>x$) and $0<x<1$, $0<y \leq 1$.

In examples of the second and third embodiment of the disclosure wherein the second mobility enhancing strain is a tensile strain and the first mobility enhancing strain is a compressive strain, SRB1 comprises $Si_{1-x}Ge_x$, SRB2 comprises $Si_{1-y}Ge_y$ and each of the first upper layer and the upper layer comprises $Si_{1-z}Gez$, wherein $x=0$, $0<y<1$, $0<z<1$ and $z<y$. In further specific examples of the second and third embodiment of the disclosure wherein the second mobility enhancing strain is a tensile strain and the first mobility enhancing strain is a compressive strain, SRB1 is made of Si, SRB2 is made of $Si_{1-y}Ge_y$ and each of the upper layer (the first upper layer depending on the embodiment) is made of $Si_{1-z}Ge_z$ with a lower amount if Ge than SRB2, wherein $0<y<1$, $0<z<1$ and $z<y$.

Example 1

In one example the starting substrate is a Si wafer with a shallow trench isolation (STI) pattern already defined (FIG. 1A).

FIG. 1B shows the starting wafer upon performing a recess etch whereby the semiconductor material (Si) is removed creating trenches in between two isolation areas/regions, the isolation regions made, for example, of SiO2. In the first trench (left) the first fin structure (I) will be grown, while in the second trench (right) the second fin structure will be grown.

FIG. 1C shows the substrate upon the epitaxial growth of the Strain Relaxed Buffer (SRB, 102) and the upper layer (110) in both trenches. In an example, the SRB and the upper layer may be grown in one step in the epi reactor. The SRB comprises/consists of SiGe with 50-70% Ge, while the upper layer comprises/consists of strained Ge. The strained Ge is subjected to compressive strain. The compressive strain has a mobility enhancement effect for PFET.

FIG. 1D shows schematically the implant mask (120) on the PFET transistor (first fin structure, I). With the mask covering the first fin structure, the second fin structure (II, NFET) is subjected to an ion implantation step such that at least a portion of the upper layer (110) which is crystalline in the as-grown state it is converted into an amorphous layer (111).

FIG. 1E shows schematically the selective laser anneal applied to the substrate but having effect only on the amorphous layer. Upon laser anneal the amorphous layer is re-crystallized and forms the strain-relaxed layer (112).

FIG. 1F shows an example of the device of the disclosure after recessing the isolation region thereby leaving two protruding fin structures each of them comprising an upper layer which is suitable to form a channel: the upper layer (110) made of Ge compressively strained and suitable to form a PFET channel with enhanced mobility and the strain-relaxed layer (112) made of strain-relaxed Ge suitable to form a NFET channel with enhanced mobility.

Example 2

Figure 2A:
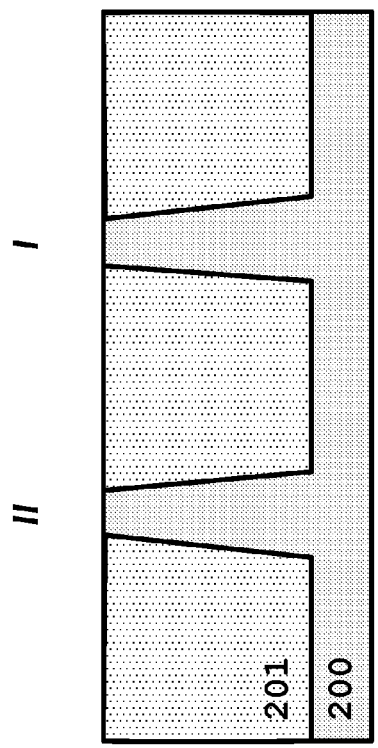
Figure 2B:
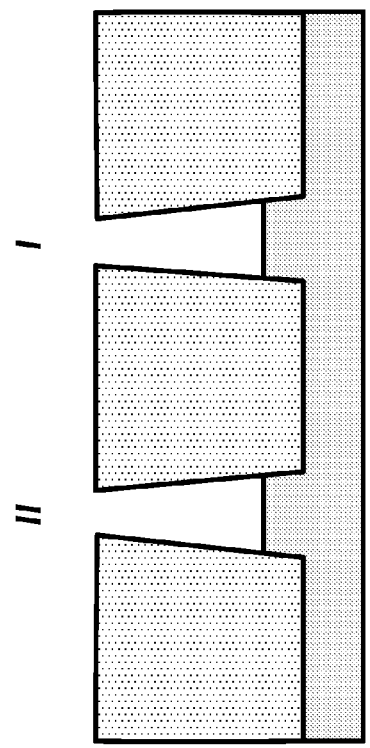

In this example FIGS. 2A and 2B describing the first two steps of the manufacturing flow are essentially the same with those described in FIGS. 1A and 1B of Example 1.

Figure 2C:
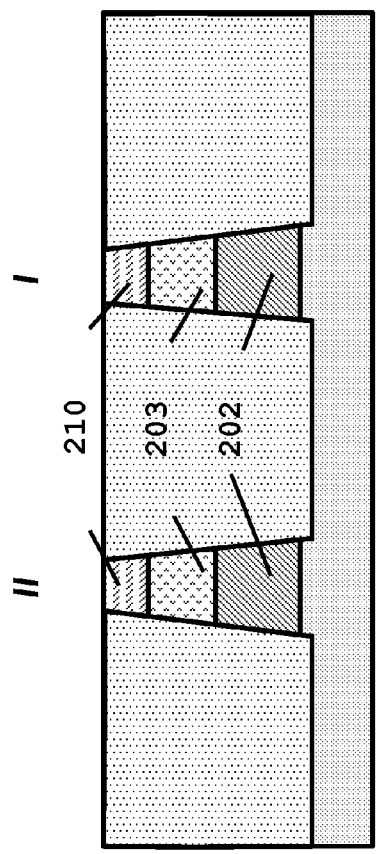

FIG. 2C shows the substrate upon the epitaxial growth of the first Strain Relaxed Buffer (SRB1, 202), the second Strain Relaxed Buffer (SRB2, 203), and the first upper layer (210) in both trenches. SRB1 comprises or consists of relaxed Ge, SRB2 comprises/consists of strained SiGe with 40% Ge, while the first upper layer comprises/consists of tensile strained SiGe with 70% Ge. The tensile strain appears because the first upper layer is lattice matched to the SRB1 and not to SRB2. The tensile strained SiGe of the first upper layer has a mobility enhancement effect for NFET.

Figure 2D:
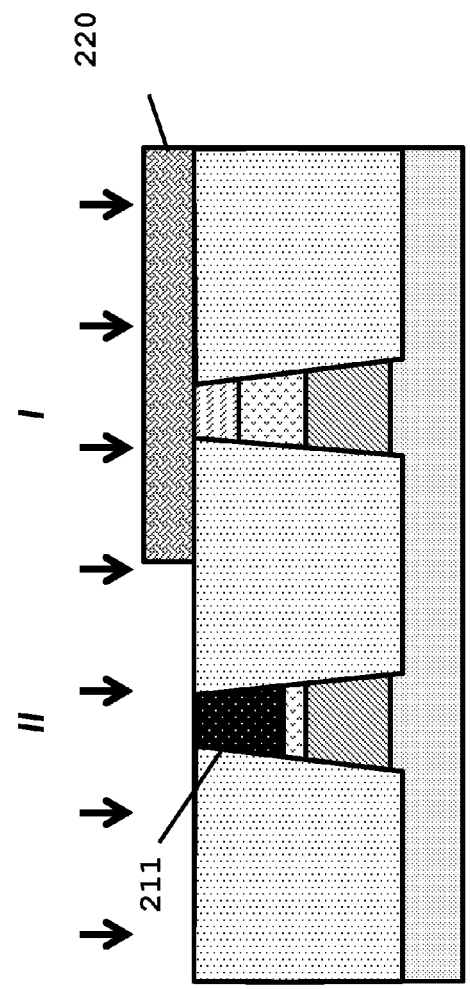

FIG. 2D shows schematically the implant mask (220) on the NFET transistor (first fin structure, I). With the mask covering the first fin structure, the second fin structure (II, PFET) is subjected to an ion implantation step such that at least the first upper layer (210) and part of SRB2 which are crystalline in the as-grown state are converted into an amorphous layer (211). Then the substrate is subjected to a selective laser anneal having effect only on the amorphous layer. Upon laser anneal the amorphous layer is re-crystallized and forms the strain-relaxed layer (212 (not shown)).

Part of the strain-relaxed layer (212 (not shown)) is removed (etched/recessed) thereby exposing a remaining strain-relaxed layer (212"). On the remaining strain-relaxed layer (212") an upper layer (213) is grown epitaxially, as illustrated in FIG. 2E. In this example wherein the strain-relaxed layer comprises/consists of SiGe with 40% Ge, the upper layer comprises/consists of compressively strained SiGe with 70% Ge. The latter upper layer is suitable to form a PFET channel.

FIG. 2F shows an example of the device of the disclosure after recessing the isolation region thereby leaving two protruding fin structures each of them comprising an upper layer which is suitable to form a channel: the first upper layer (210) made of tensile strained SiGe70% suitable to form a NFET channel with enhanced mobility and the compressively strained upper layer (213) made of SiGe70% suitable to form a PFET channel with enhanced mobility.

Example 3

In this example FIGS. 3A and 3B describing the first two steps of the manufacturing flow are essentially the same with those described in FIGS. 1A and 1B of Example 1.

FIG. 3C shows the substrate upon the epitaxial growth of the first Strain Relaxed Buffer (SRB1, 302) and the second Strain Relaxed Buffer (SRB2, 303). Remarkably there is no upper layer present while the trenches are filled, thus the upper layer can be considered as being made of the same material (having the same composition) with SRB2. SRB1 comprises/consists of relaxed Ge and SRB2 comprises/consists of strained SiGe with 40% Ge.

Figure 3D:
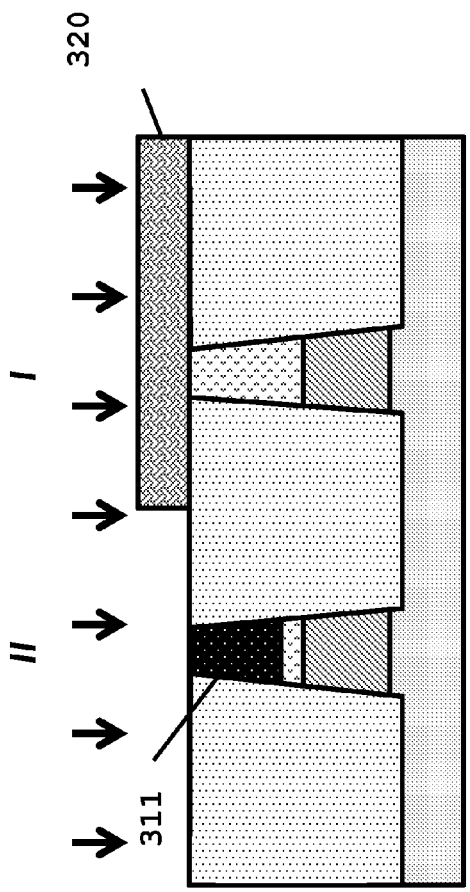

FIG. 3D shows schematically the implant mask (320) on the NFET transistor (first fin structure, I). With the mask covering the first fin structure, the second fin structure (II, PFET) is subjected to an ion implantation step such that part of SRB2 which is crystalline in the as-grown state is converted into an amorphous layer (311).

Figure 3E:
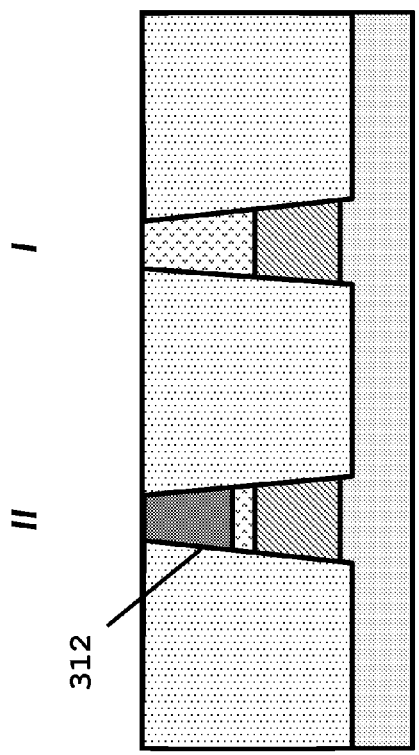

Then the substrate is subjected to a selective laser anneal having effect only on the amorphous layer. Upon laser anneal the amorphous layer is re-crystallized and forms the strain-relaxed layer (312) as shown in FIG. 3E.

Figure 3F:
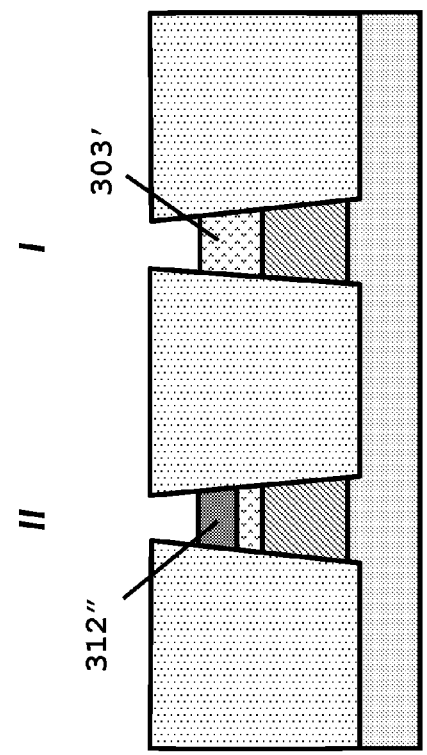

Part of the strain-relaxed layer (312) is removed (etched/recessed) thereby exposing a remaining strain-relaxed layer (312"). At the same time (in the same process step/simultaneously) part of SRB2 is removed (recessed) from the first fin structure thereby exposing a remaining SRB2 (303') as illustrated in FIG. 3F.

Thereafter on the remaining strain-relaxed layer (312") and on the remaining SRB2 (303') an upper layer (313', 313") is grown epitaxially, as illustrated in FIG. 3G. The upper layer of the first fin structure and of the second fin structure have the same composition (being grown in the same process step) but the strain in each case is different. In an example both (313') and (313") are made of SiGe with 70% Ge, but (313') is tensile strained on the strained SiGe40% SRB2 (303'), while (313") is compressively strained on the strain-relaxed SiGe40% (312").

FIG. 3H shows an example of the device of the disclosure after recessing the isolation region thereby leaving two protruding fin structures, each of them comprising an upper layer which is suitable to form a channel: the upper layer (313') made of tensile strained SiGe70% suitable to form a NFET channel with enhanced mobility and the compressively strained upper layer (313") made of SiGe70% suitable to form a PFET channel with enhanced mobility.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

The invention claimed is:

1. A dual channel FinFET device having at least one channel subjected to a mobility enhancement strain, the device comprising:

a substrate comprising at least two fin structures separated by an isolation region, wherein each of the at least two fin structures is in physical contact with a source region and a drain region, wherein each of the at least two fin structures comprise:
an upper layer suitable to form an n-type channel or a p-type channel, and
a strain-relaxed buffer (SRB) underlying and in contact with the upper layer, and overlying and in contact with the substrate, wherein, for a first fin structure, compositions of the upper layer and the SRB are selected such that the upper layer of the first fin structure is subjected to a mobility enhancing strain in an as-grown state, the mobility enhancing strain being applied in a longitudinal direction from the source region to the drain region, and wherein at least a portion of the upper layer of a second fin structure comprises a strain-relaxed upper layer.

2. The device according to claim 1, wherein the mobility enhancing strain is a compressive strain.

3. The device according to claim 2, wherein the SRB comprises $Si_{1-x}Ge_x$ and the upper layer comprises $Si_{1-y}Ge_y$, wherein $y>x$, $0<x<1$ and $0<y\leq1$.

4. The device according to claim 2, wherein the SRB comprises $Si_{1-w}C_w$ and the upper layer comprises $Si_{1-y}Ge_y$, wherein $0<w\leq0.1$ and $0\leq y\leq0.25$.

5. The device according to claim 1, wherein the mobility enhancing strain is a tensile strain.

6. The device according to claim 5, wherein the SRB comprises $Si_{1-x}Ge_x$ and the upper layer comprises $Si_{1-y}Ge_y$, wherein $y<x$, $0<x<1$ and $0\leq y<1$.

7. The device according to claim 5, wherein the SRB comprises $Ge_{1-t}Sn_t$ and the upper layer comprises $Si_{1-y}Ge_y$, wherein $0<t\leq0.1$ and $0.75\leq y\leq1$.

8. A dual channel FinFET device comprising:
a substrate comprising at least two fin structures separated by an isolation region, wherein each of the at least two fin structures is in physical contact with a source region and a drain region, and wherein each of the at least two fin structures comprises a strain relaxed buffer (SRB), wherein the SRB comprises at least a first SRB layer overlying and in contact with the substrate and a second SRB layer overlying and in contact with the first SRB layer;

a first fin structure of the at least two fin structures comprising a first upper layer overlying and in contact with the second SRB layer of the first fin structure, the first upper layer being suitable to form an n-type or p-type channel, wherein a composition of the first upper layer and the second SRB layer of the first fin structure is selected such that the first upper layer is subjected to a first mobility enhancing strain in an as-grown state, the first mobility enhancing strain being applied in a longitudinal direction from the source region to the drain region; and a second fin structure of the at least two fin structures comprising a third SRB layer and a second upper layer, wherein the third SRB layer is overlying and in contact with the second SRB layer of the second fin structure, wherein the second upper layer is overlying and in contact with the third SRB layer, wherein a composition of the second upper layer is selected such that the second upper layer is subjected to a second mobility enhancing strain in an as-grown state, the second mobility enhancing strain being applied in a longitudinal direction from the source region to the drain region.

9. The device according to claim 8, wherein the second mobility enhancing strain is a compressive strain and the first mobility enhancing strain is a tensile strain.

10. The device according to claim 8, wherein the first SRB layer comprises $Si_{1-x}Ge_x$ and the second SRB layer comprises $Si_{1-y}Ge_y$, and wherein each of the first upper layer and the second upper layer comprises $Si_{1-z}Ge_z$, wherein $y<z<x$, $0<x\leq1$, $0<y<1$, and $0<z<1$.

11. The device according to claim 8, wherein the first SRB layer comprises $Si_{1-x}Ge_x$ and the second SRB layer comprises $Si_{1-w}C_w$, and wherein each of the first upper layer and the second upper layer comprises $Si_{1-y}Ge_y$, wherein $y<x$, $0<x\leq1$, $0\leq y<1$, and $0<w\leq0.1$.

12. The device according to claim 8, wherein the first SRB layer comprises $Ge_{1-t}Sn_t$ and the second SRB layer comprises $Si_{1-x}Ge_x$, and wherein each of the first upper layer and the second upper layer comprises $Si_{1-y}Ge_y$, wherein $y>x$, $0<x<1$, $0\leq y<1$, and $0<t\leq0.1$.

* * * * *